US008274151B2

(12) United States Patent
Rey et al.

(10) Patent No.: US 8,274,151 B2
(45) Date of Patent: Sep. 25, 2012

(54) OBJECT INCLUDING A GRAPHIC ELEMENT TRANSFERRED ON A SUPPORT AND METHOD FOR MAKING SUCH AN OBJECT

(75) Inventors: Alain Rey, Mours St Eusebe (FR); Chrystel Deguet, Saint Ismier (FR); Laurent Vandroux, Le Cheylas (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 62 days.

(21) Appl. No.: 12/812,561

(22) PCT Filed: Jan. 23, 2009

(86) PCT No.: PCT/EP2009/050785
§ 371 (c)(1),
(2), (4) Date: Oct. 4, 2010

(87) PCT Pub. No.: WO2009/092799
PCT Pub. Date: Jul. 30, 2009

(65) Prior Publication Data

US 2011/0018132 A1 Jan. 27, 2011

(30) Foreign Application Priority Data

Jan. 25, 2008 (FR) ..................................... 08 50472

(51) Int. Cl.
*H01L 23/48* (2006.01)

(52) U.S. Cl. ................. 257/739; 257/E21.295; 438/665

(58) Field of Classification Search .................. 257/739, 257/E21.295; 438/665
See application file for complete search history.

(56) References Cited

U.S. PATENT DOCUMENTS 4,490,440 A 12/1984 Reber
4,604,329 A 8/1986 Reber
4,725,511 A 2/1988 Reber
5,552,628 A 9/1996 Watanabe et al.
5,972,233 A 10/1999 Becker et al.
7,036,339 B1 5/2006 Chia et al.
7,632,759 B2 * 12/2009 Hoeglauer et al. ............ 438/758
2005/0130400 A1 6/2005 Grupp et al.

(Continued)

FOREIGN PATENT DOCUMENTS

DE 36 32 622 4/1987

(Continued)

OTHER PUBLICATIONS

U.S. Appl. No. 13/384,035, filed Jan. 13, 2012, Deguet, et al.

(Continued)

*Primary Examiner* — Zandra Smith
*Assistant Examiner* — Marvin Payen
(74) *Attorney, Agent, or Firm* — Oblon, Spivak, McClelland, Maier & Neustadt, L.L.P.

(57) ABSTRACT

An object including at least one graphic element, including at least one layer including at least one metal and etched according to a pattern of the graphic element, a first face of the layer being positioned opposite a face of at least one at least partly transparent substrate, a second face, opposite to the first face, of the layer being covered with at least one passivation layer fixed to at least one face of at least one support by wafer bonding and forming with the support a monolithic structure, and the layer including at least at the second face, at least one area including the metal and at least one semiconductor.

19 Claims, 3 Drawing Sheets

10

U.S. PATENT DOCUMENTS

Figure 1A:
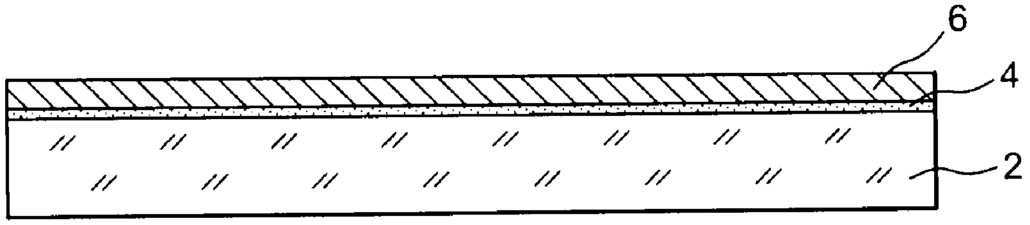

2008/0311725 A1 12/2008 Di Cioccio et al.

FOREIGN PATENT DOCUMENTS

| | | |
|---|---|---|
| EP | 0 450 558 | 10/1991 |
| EP | 0 627 763 | 12/1994 |
| EP | 1 544 178 | 6/2005 |
| FR | 2 851 496 | 8/2004 |
| FR | 2 888 402 | 1/2007 |
| WO | 99 55188 | 11/1999 |

OTHER PUBLICATIONS

International Search Report issued Sep. 28,2009 in PCT/EP09/50785 filed Jan. 23, 2009.

Baumann, H. et al., "Bonding of Structured Wafers", Proceedings of the Third International Symposium on Semiconductor Wafer Bonding: Physics and Applications, Electrochemical Society Proceedings, vol. 95-7, pp. 471-487, (1995).

U.S. Appl. No. 12/863,314, filed Jul. 16, 2010, Rey, et al.

* cited by examiner

OBJECT INCLUDING A GRAPHIC ELEMENT TRANSFERRED ON A SUPPORT AND METHOD FOR MAKING SUCH AN OBJECT

TECHNICAL FIELD

The invention relates to an object, such a massive object, for example of the jewel, stone, watch type (for example a watch glass, a dial or a case bottom), a mobile electronic equipment (for example a window or a screen) or any other solid medium, including a graphic element, graphics, such as a decoration, typographic characters, a drawing or a further a photograph, for example with micrometric and/or nanometric dimensions. The invention also relates to a method for making such an object.

The invention finds applications in various industrial, cultural or artistic fields. For the watch industry, watch glasses or case bottoms may be made according to the invention in order to produce very robust graphics or semi-transparent decorations of very high visual quality.

The invention may also be applied in the field of jewelry, notably for producing stones including decorations or texts with micrometric and/or nanometric dimensions, for example used for making pendants, rings, or earrings.

The invention may also be used for achieving the storage of a large amount of information in small volumes (for example a few $cm^2$ of surface area for less than 2 mm of thickness) with very good durability (several thousand or million years).

PRIOR ART

Making objects including decorations or graphics with micrometric size obtained by applying techniques from microtechnologies, for example by photolithography on an object is known. However the durability and the mechanical robustness of these decorations made on the surface of objects are generally poor.

A method for protecting graphics made on an object is described in document FR 2 851 496. In this document, the graphics are first made by photolithography on a transparent substrate. The substrate is then turned over and then fixed onto the desired object by adhesive bonding or crimping.

Such a method has several drawbacks. Indeed, the adhesives used for fixing the substrate to the object include organic materials having limited life-time. The thereby produced objects therefore have limited life-time. On the other hand, the optical properties of these adhesives are degraded over time which alters the legibility of graphics made on the substrate. Crimping allows solid mechanical assembling of the substrate to the object, but does not ensure good integrity of the object and of its graphics since the achieved crimping may be disassembled without destroying the object, which poses a problem if it is desired to make an object including tamper-proof graphics.

DISCUSSION OF THE INVENTION

An object of the present invention is to propose an object including one or more graphic elements, as well as a method for making such an object, not having the drawbacks of the prior art as described earlier.

For this, the present invention proposes an object provided with at least one graphic element, including at least one layer etched according to a pattern of the graphic element, a first face of said layer being positioned opposite a face of at least one at least partly transparent substrate, a second face, opposite to the first face, of said layer, being covered by at least one passivation layer fixed to at least one face of at least one support by wafer bonding (molecular adhesion) and forming with the support a monolithic structure.

Said layer etched according to the pattern of the graphic element may be composed of at least one metal. Further, said layer etched according to the pattern of the graphic element may include, at least at the second face, at least one area composed of said metal and of at least one semiconductor.

Thus, the graphic element, which may have micrometric and/or nanometric dimensions, is made on the object in a robust, durable and integrated way (impossible detachment without degrading the object) by means of bonding by wafer bonding achieved between the passivation layer and the support of the object.

The graphic(s) or text(s) formed by the graphic element are therefore hermetically sealed between two massive solid components, the substrate on the one side and the support on the other side, by means of the achieved bonding by wafer bonding. This hermetic seal notably forms a barrier to diffusion of humidity or of any other gas or liquid chemical product (except products which may destroy the substrate or the support).

With bonding by wafer bonding, it is possible to form a monolithic and robust structure from the substrate and from the support of the object, in which the graphic element is enclosed. The adhesion forces between the substrate and the support are greater than the cohesion forces of the materials. Thus, any attempt to detach the substrate with the support would lead to complete destruction of the object.

Further, with bonding by wafer bonding, it is possible to use mineral materials, the optical properties of which are stable over time. The achieved structure therefore does not undergo any degradation of its optical properties (notably the visibility of the graphic element) due to time.

The graphic element is mechanically protected by the whole thickness of the substrate on one side and by the support on the other side. The latter have to be abraded or worn entirely before destroying the graphic element. This protection may therefore be maximized by selecting very hard materials, for example sapphire for the substrate which can only be scratched by silicon carbide or diamond.

This object may be made independently of the density of the patterns of the graphic element.

When the graphic element is made in a metal layer, the graphics or texts may therefore be made with a precious and very stable material, i.e. insensitive to corrosion or to degradations over time.

By means of the area composed of metal and of semiconductor formed in the layer including the graphic element, very good adherence of the passivation layer on the layer including the graphic element is obtained, with this adherence it is possible to prevent any deterioration of the object for example upon subsequent cutting of the layers forming the object (cutting out wafers).

The substrate may be composed of at least one amorphous or crystalline material and/or the passivation layer may be composed of at least one mineral material.

The object may further include an adherence layer positioned between the first face of the layer, in which the graphic element is formed, and the face of the substrate.

In this case, the graphic element may also be etched in the adherence layer.

The adherence layer may be composed of at least one metal and/or of a metal nitride and/or a metal oxide.

The object may further include at least one adhesion layer positioned between the face of the support and the passivation layer; wafer bonding may be formed between the adhesion layer and the passivation layer.

By means of the adhesion layer deposited on the support before wafer bonding, the support may be of any nature or composed of any material. This material may notably be compatible with possible annealing allowing consolidation of the wafer bonding.

The object may for example be a jewel, a watch, or an electronic device.

Said area of the layer may be composed of silicide.

The invention also relates to a method for making an object provided with at least one graphic element, including at least the steps of:

a) depositing at least one layer above, or opposite to, a face of at least one at least partly transparent substrate, b) etching said layer according to a pattern of the graphic element, c) depositing at least one passivation layer at least on said layer including the etched graphic element and on portions of the face of the substrate not covered by the layer including the etched graphic element, d) fixing the passivation layer to at least one face of at least one support by wafer bonding, forming a monolithic structure.

The invention further relates to a method for making an object provided with at least one graphic element, including at least the steps of:

a) depositing at least one layer above, or opposite to, a face of at least one at least partly transparent substrate, b) etching said layer according to a pattern of the graphic element, c) forming in said layer, at least at a second face of said layer opposite to a first face of said layer being located on the side of the substrate, at least one area composed of said metal and of at least one semiconductor, d) depositing at least one passivation layer at least on said layer including the etched graphic element and on portions of the face of the substrate not covered by the layer including the etched graphic element, e) fixing the passivation layer to at least one face of at least one support by wafer bonding, forming a monolithic structure.

The method may further include, before the step a) for depositing the layer, a step for depositing an adherence layer onto the face of the substrate, said layer being then deposited, during step a) onto the adherence layer.

The graphic element may also be etched, during step b), in the adherence layer.

The method may further include, between the step d) for depositing the passivation layer, and the step e) for fixing, a step for annealing at a temperature comprised between about 400° C. and 1,100° C., the substrate including the passivation layer.

The method may further include, between the step d) for depositing the passivation layer and the step e) for fixing, a step for planarization of the passivation layer.

The step b) for etching the graphic element may be achieved by applying masking, lithographic and etching steps in said layer and/or in an adherence layer positioned between the face of the substrate and said layer, or at least one laser ablation step directly in said layer and/or in an adherence layer positioned between the face of the substrate and said layer.

The method may further include, before the step e) for fixing, a step for depositing at least one adhesion layer at least onto the face of the support, the step e) for fixing being achieved by applying a bonding by wafer bonding between said adhesion layer and the passivation layer.

The method may further comprise, between the step for depositing the adhesion layer and the step e) for fixing, a step for planarization of the adhesion layer.

The method may further include, between the step for depositing the adhesion step and the step e) for fixing, a step for annealing at a temperature comprised between about 400° C. and 1,100° C., the support including the adhesion layer.

The method may further include, after the step e) for fixing, a step of heat treatment by annealing of the object consolidating wafer bonding.

Step c) for forming the area composed of said metal and of a semiconductor is achieved by applying a step for siliconizing (silicidation) said layer.

SHORT DESCRIPTION OF THE DRAWINGS

The present invention will be better understood upon reading the description of exemplary embodiments given purely as an indication and by no means as a limitation with reference to the appended drawings wherein:

FIGS. 1A-1H illustrate the steps of a method for making an object, object of the present invention, according to a particular embodiment.

Identical, similar or equivalent parts of the various figures described hereafter bear the same numerical references so as to facilitate the passage from one figure to the other.

The different parts illustrated in the figures are not necessarily illustrated according to a uniform scale, in order to make the figures more legible.

The different possibilities (alternatives) should be understood as not being exclusive of each other and they may be combined together.

DETAILED DISCUSSION OF EMBODIMENTS OF THE INVENTION

An exemplary method for making an object 100 including a graphic element transferred onto a support 20, for example a massive object such as a jewel, a watch, or further an electronic equipment, will be described in connection with FIGS. 1A-1H.

As illustrated in FIG. 1A, a deposit is first of all made on a plane face of a substrate 2, for example a transparent or at least partly transparent substrate composed of an amorphous material, such as glass, or a crystalline material such as sapphire or diamond, of an adherence layer 4 onto which is deposited a layer 6. The thickness of the substrate 2 is for example equal to a few hundred micrometers, or comprised between about 100 μm and 1 mm. The thickness of the support 20 (illustrated in FIGS. 1F-1H) may notably be greater than or equal to the thickness of the substrate 2.

The layers 4 and 6 are for example obtained by depositions of the PVD type (evaporation or sputtering). In the embodiment described here, the layer 6 is composed of metal, for example gold, platinum, tungsten, titanium, metal oxide, etc. The material of the layer 6 may notably be opaque to the light. The thickness of this layer 6 is for example comprised between about 50 nm and 100 nm. The thickness of the layer 6 may notably be selected depending on the nature of the material forming the layer 6, the selected thickness being sufficient for obtaining certain opacity of the layer 6. Thus, given that the graphic element which one wishes to make, will be etched in the layer 6 and that this graphic element will be visible through the substrate 2 on the object 100, the opacity of the material of the layer 6 will allow the graphic element made in the layer 6 to be visually conspicuous. The adherence layer 4 is for example composed of titanium, of titanium nitride, of titanium oxide or of any other material, with which good adherence between the layer 6 and the substrate 2 may be obtained. The nature of the adherence layer 4 may notably be selected depending on the nature of the substrate 2 and of the layer 6. The thickness of this adherence layer 4 may for example be comprised between about 1 nm and 10 nm.

In an alternative, the layer 6 may be directly deposited on the substrate 2 without using any intermediate adherence layer 4 between the substrate 2 and the layer 6.

Figure 1B:
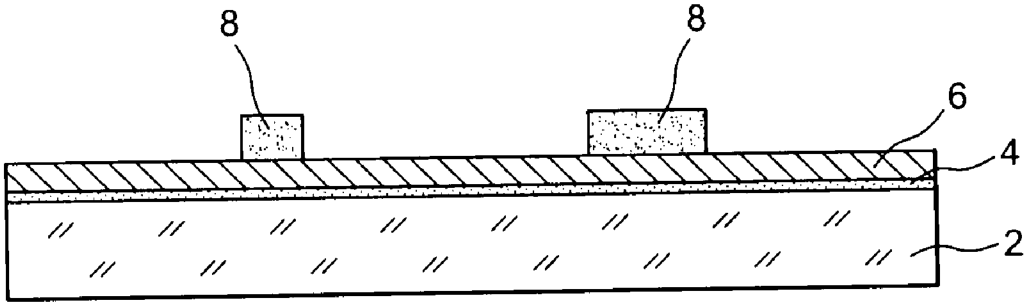

A mask 8, the pattern of which corresponds to that of the graphic element to be made, is then formed on the layer 6 (FIG. 1B). For this, a photosensitive resin layer is for example deposited on the layer 6. One or more lithographic or etching steps are then applied for forming the mask 8. In the exemplary embodiment described here, the mask 8 is therefore formed by the remaining portions of the photosensitive resin layer deposited on the layer 6. The photosensitive resin layer is therefore directly used in order to form the etching mask 8. In the example described here, the photosensitive resin is positive, the pattern of the graphic element being formed by the portions of the mask 8. However, it is also possible to use a negative photosensitive resin.

Figure 1C:
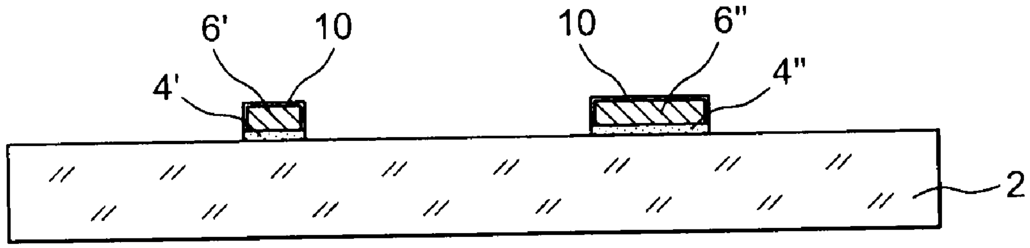

As illustrated in FIG. 1C, the layer 6, as well as the adherence layer 4, is then etched via an isotropic or anisotropic or dry chemical route (plasma mode, reactive ion etching or ion machining). The etching mask 8 is then removed. The pattern of the graphic element is therefore transferred into the layer 6 and formed by remaining portions 6' and 6" of the layer 6, as well as by remaining portions 4' and 4" of the adherence layer 4.

In an alternative embodiment, it is possible that the mask 8 be formed in a layer, for example of the mineral type (for example composed of silicon dioxide), deposited on the layer 6, and on which the photosensitive resin layer is then deposited. The pattern of the graphic element is then formed by lithography and etching in the resin layer. This pattern is then transferred into the mineral layer by etching. Finally, the remaining portions of the resin layer are then removed by etching. The mask 8 is in this case formed by the remaining portions of the mineral layer. This alternative may notably be used for making an etching mask resistant to certain etching agents, used for etching the layer 6 and/or the adherence layer 4, which may cause damage to a mask composed of resin (for example aqua regia). The selection of either alternative embodiment of the mask may be made depending on the material to be etched (the material of layers 6 and 4).

In an alternative of the described method, it is possible not to use an etching mask. In this case, the pattern of the graphic element is directly made in the layer 6, and optionally in the adherence layer 4 if the latter is present between the layer 6 and the substrate 2, for example by laser ablation which may notably be carried out with a femtosecond laser.

Next, an area 10 composed of the metal of the layer 6 and of a semiconductor is formed in the remaining portions (portions 6'and 6" in FIG. 1C) of the etched layer 6. For this, a siliconizing of the etched portions 6' and 6" is carried out for example. This siliconizing is for example obtained by decomposition of the silane ($SiH_4$, or more generally any gas of the $Si_nH_{2n+2}$ type) under a controlled atmosphere, at a temperature comprised for example between 200° C. and 450° C. and preferably equal to about 300° C. The thereby decomposed gas reacts with the metal of the layer 6 in order to form the area 10. For example, when the layer 6 is composed of Pt, the area obtained after siliconizing is then composed of PtSi. It is also possible that the area 10 be composed of a semiconductor other than silicon. This area 10 is for example made on a thickness comprised between about 1 nm and 50 nm, or, if the metal layer 6 has a thickness greater than 50 nm, on a thickness comprised between about 1 nm and the whole thickness of the layer 6.

Figure 1D:
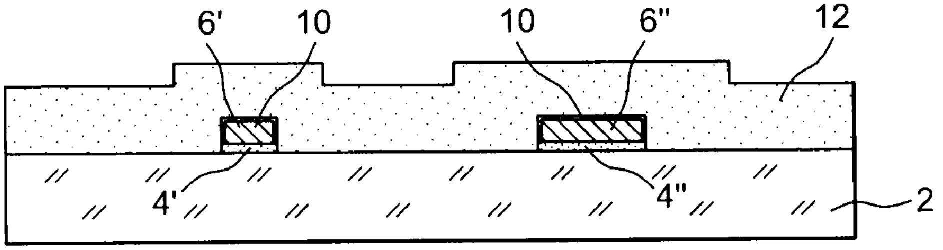

In FIG. 1D, a passivation layer 12 is then deposited, for example by CVD (chemical vapor deposition) or by PVD. This passivation layer 12 is for example composed of a mineral material, such as silicon dioxide or silicon nitride. The material of this passivation layer 12 is notably selected in order to be able to subsequently achieve wafer bonding with the support 20. This passivation layer 12 is also intended to ensure protection of the pattern formed by the remaining portions 6', 6" of the layer 6.

In an alternative, it is also possible to first of all achieve deposition of an anti-reflective layer and/or other layers onto the remaining portions 6', 6" of the layer 6 and onto the face of the substrate 2 including these remaining portions 6', 6", and then deposit the passivation layer 12 onto this anti-reflective layer and/or onto the other layers.

By the presence of the area 10 at the surface of the remaining portions 6' and 6" of the metal layer 6, adherence of the passivation layer 12 onto these portions 6' and 6" is improved. Preferably, the formation of the area 10 for example obtained by a siliconizing step, may be applied in situ, i.e. made in the equipment used for achieving deposition of the passivation layer 12, without applying any other steps between the step for making the area 10 and the deposition of the passivation layer 12, so that the area 10 cannot be exposed to the outside environment; better adherence properties of the area 10 toward the passivation layer 12 may thereby be preserved.

Figure 1E:
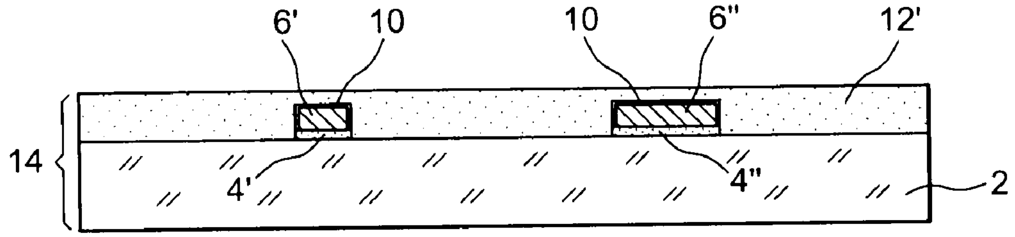

The passivation layer 12 is then planarized, for example by a mechanochemical polishing step, thereby giving the possibility of removing the relief formed by the remaining portions 6, 6" of the layer 6 and the remaining portions of the adherence layer 4', 4" relative to the surface of the substrate 2 on which are made the remaining portions 6', 6" of the layer 6 and the remaining portions 4', 4" of the adherence layer 4. A thin passivation film 12' is thereby formed, having a planar surface, above the remaining portions 6', 6" (FIG. 1E). The thin passivation film 12' may for example have a thickness comprised between about 100 nm and 1 μm.

An assembly 14 is thereby obtained, formed here by the substrate, the remaining portions 6', 6" of the layer 6, the remaining portions 4', 4" of the adherence layer 4 and the thin passivation film 12' including the pattern of the graphic element which one wishes to transfer onto the support 20 of the object 100.

It is possible to subject the assembly 14 to stabilization annealing, for example at a temperature comprised between about 400° C. and 1,100° C., in order to avoid possible degassing by the oxides present in the assembly 14 during wafer bonding achieved subsequently during the making method described here, and therefore to consolidate wafer bonding.

In parallel with the making of the assembly 14, the support 20 may be prepared for receiving the transfer of the assembly 14.

Figure 1F:
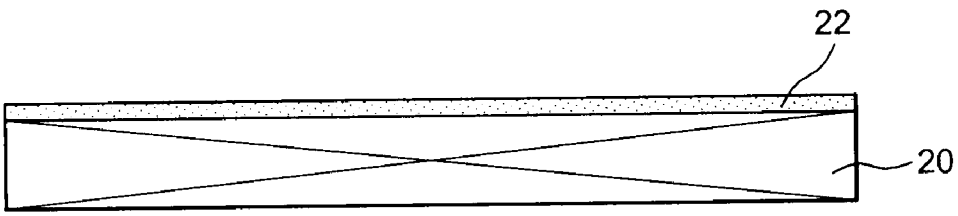

For this, as illustrated in FIG. 1F, an adhesion layer 22 is deposited, for example by deposition of the CVD or PVD type, onto a face of the support 20 intended to receive the assembly 14. This adhesion layer 22 may be composed of a mineral material such as silicon dioxide or silicon nitride, and/or of a nature similar to that of the passivation layer 12. The material of the adhesion layer 22 is notably selected so as to be able to subsequently achieve wafer bonding with the assembly 14 and more particularly with the passivation layer 12'. It is also possible to cover the other faces of the support 20 with the material of the adhesion layer 22 in order to achieve mechanical protection of the support 20 during subsequent steps of the method.

It is possible to subject the support 20 and the adhesion layer 22 to stabilization annealing, for example at a temperature comprised between about 400° C. and 1,100° C., in order to avoid possible degassing, for example when the adhesion layer 22 is composed of silicon dioxide, during the wafer bonding subsequently achieved during the making method described herein, and therefore to consolidate wafer bonding.

Figure 1G:
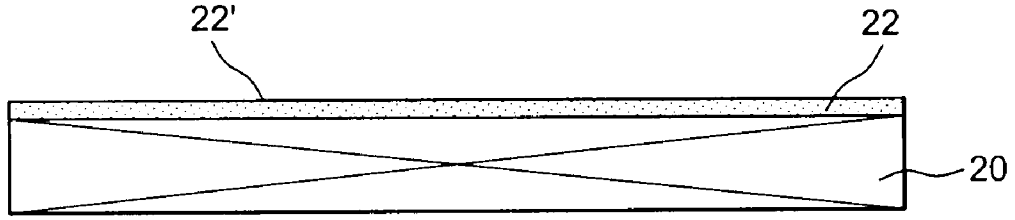

A surface treatment of the adhesion layer is then carried out, for example mechanochemical polishing of the surface 22' of the adhesion layer 22, allowing removal of the possible roughness of the support 20 which may again be found at the face 22' of the adhesion layer 22 (FIG. 1G). A planar face 22' is thereby obtained.

Figure 1H:
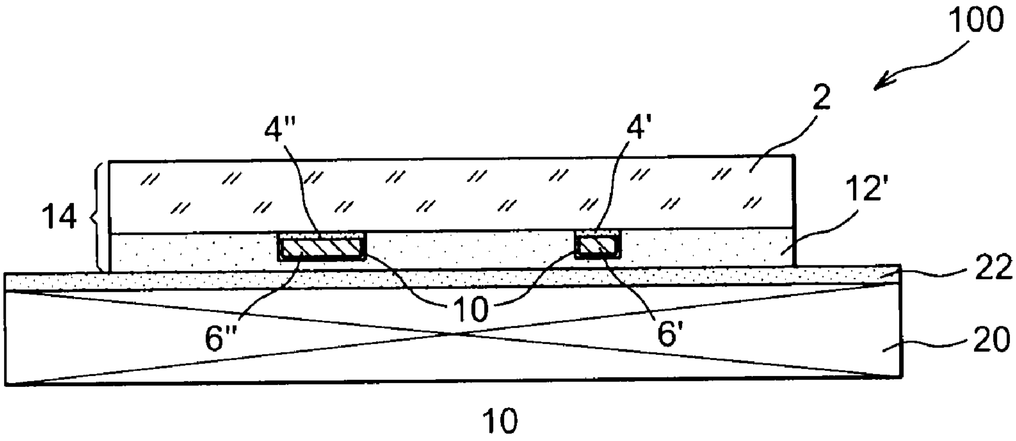

Finally, as illustrated in FIG. 1H, the assembly 14, or a portion of the assembly 14, including the graphic element, is transferred onto the support 20 by wafer bonding, without supplying any material. In the embodiment described here, wafer bonding is achieved between the adhesion layer 22 and the thin passivation film 12' which are here composed of the same material. When the support 20 is composed of a material which may achieve adhesion by wafer bonding with the passivation layer 12', the adhesion layer 22 may be omitted. The roughness of the surfaces bonded by wafer bonding may be less than about 1 nm or 0.5 nm.

A step for heat treatment of the object (support+transferred assembly) may then be carried out allowing consolidation of the achieved wafer bonding. This heat treatment may notably be annealing carried out at a temperature comprised between about 250° C. and 1,200° C. Advantageously, this annealing may be carried out at a greater temperature than about 850° C. in order to obtain the best possible robustness between the layers 12 and 22 (at least equivalent to that of a massive material).

The object 100 is thereby obtained, including the graphic element formed by the portions 4', 4", 6', 6" visible through the substrate 2 and/or the support 20 and embedded in the thereby formed monolithic structure.

The invention claimed is:

1. An object comprising:

at least one graphic element, including at least one layer including at least one metal and etched according to a pattern of the graphic element, a first face of the layer being positioned opposite a face of at least one at least partly transparent substrate, a second face, opposite to the first face, of the layer being covered with at least one passivation layer fixed to at least one face of at least one support by wafer bonding and forming, with the support, a monolithic structure, and the layer further including, at least at the second face, at least one area including the metal and at least one semiconductor.

2. The object according to claim 1, wherein the substrate includes at least one amorphous or crystalline material and/or the passivation layer including at least one mineral material.

3. The object according to claim 1, further comprising an adherence layer positioned between the first face of the layer, in which the graphic element is formed, and the face of the substrate.

4. The object according to claim 3, wherein the graphic element is also etched in the adherence layer.

5. The object according to claim 3, wherein the adherence layer includes at least one metal and/or of a metal nitride and/or a metal oxide.

6. The object according to claim 1, further comprising at least one adhesion layer positioned between the face of the support and the passivation layer, the wafer bonding being formed between the adhesion layer and the passivation layer.

7. The object according to claim 1, the object being a jewel, a watch, or an electronic device.

8. The object according to claim 1, wherein the area of the layer includes silicide.

9. A method for making an object including at least one graphic element, comprising:

a) depositing at least one layer including at least one metal above a face of at least one at least partly transparent substrate;

b) etching the layer according to a pattern of the graphic element;

c) forming, in the layer, at least at a second face of the layer opposite to a first face of the layer located on the side of the substrate, at least one area including the metal and at least one semiconductor;

d) depositing at least one passivation layer at least onto the layer including the etched graphic element and onto portions of the face of the substrate not covered by the layer including the etched graphic element; and e) fixing the passivation layer to at least one face of at least one support by wafer bonding, forming a monolithic structure.

10. The method according to claim 9, further comprising, before the depositing a), depositing an adherence layer onto the face of the substrate, the layer then deposited during the depositing a), being deposited onto the adherence layer.

11. The method according to claim 10, wherein the graphic element is also etched during the etching b), in the adherence layer.

12. The method according to claim 9, further comprising between the depositing d) and the fixing e), annealing, at a temperature between about 400° C. and 1,100° C., the substrate including the passivation layer.

13. The method according to claim 9, further comprising between the depositing d) and the fixing e), planarization of the passivation layer.

14. The method according to claim 9, wherein the etching b) the graphic element is obtained by applying masking, lithographic and etching in the layer and/or in an adherence layer positioned between the face of the substrate and the layer, or at least one laser ablation directly in the layer and/or in an adherence layer positioned between the face of the substrate and the layer.

15. The method according to claim 9, further comprising, before the fixing e), depositing at least one adhesion layer at least onto the face of the support, the fixing e) being obtained by applying a bonding by wafer bonding between the adhesion layer and the passivation layer.

16. The method according to claim 15, further comprising, between the depositing the adhesion layer and the fixing e), planarization of the adhesion layer.

17. The method according to claim 15, further comprising, between the depositing the adhesion layer and the fixing e), annealing, at a temperature comprised between about 400° C. and 1,100° C., the support including the adhesion layer.

18. The method according to claim 9, further comprising, after the fixing e), heat treatment by annealing the object consolidating wafer bonding.

19. The method according to claim 9, wherein the forming c) the area composed of the metal and a semiconductor is obtained by siliconizing the layer.

* * * * *